US008713498B2

(12) United States Patent
Shroff et al.

(10) Patent No.: US 8,713,498 B2
(45) Date of Patent: Apr. 29, 2014

(54) METHOD AND SYSTEM FOR PHYSICAL VERIFICATION USING NETWORK SEGMENT CURRENT

(75) Inventors: Mehul D. Shroff, Austin, TX (US); Ertugrul Demircan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/216,769

(22) Filed: Aug. 24, 2011

(65) Prior Publication Data

US 2013/0055184 A1    Feb. 28, 2013

(51) Int. Cl.
*G06F 17/50* (2006.01)

(52) U.S. Cl.
USPC ............................ 716/111; 716/110; 716/125

(58) Field of Classification Search
None
See application file for complete search history.

(56) References Cited

U.S. PATENT DOCUMENTS

| | | | | |
|---|---|---|---|---|
| 5,532,509 A | * | 7/1996 | D'Addeo | 257/618 |
| 5,598,348 A | * | 1/1997 | Rusu et al. | 716/115 |
| 5,828,580 A | * | 10/1998 | Ho | 716/115 |
| 5,831,867 A | * | 11/1998 | Aji et al. | 716/112 |
| 6,038,383 A | * | 3/2000 | Young et al. | 716/113 |
| 6,128,768 A | * | 10/2000 | Ho | 716/115 |
| 6,159,841 A | * | 12/2000 | Williams et al. | 438/619 |
| 7,216,314 B2 | | 5/2007 | Decloedt | |

OTHER PUBLICATIONS

Cadence Design Systems, Inc., "Learning to Live with Electromigration," White Paper, 2002, printed from <http://w2.cadence.com/whitepapers/4252_EM_WP_fnl.pdf>> on Aug. 24, 2011, 7 pages.
Cadence Design Systems, Inc., "Virtuoso Analog Electrostorm Option," Data Sheet, 2007, printed from <<http://www.cadence.com/rl/Resources/datasheets/4912_VirtuosoVolStorm_DSfnl.pdf>> on Aug. 24, 2011, 3 pages.
Seth, Anurag, "Electromigration in Integrated Circuits," Workshop on Reliability and Physical Verification, IIT Delhi, Dec. 12, 2009; printed presentation from <<http://www.masamb.com/EM-IITD.pdf>> on Aug. 24, 2011, 46 pages.

* cited by examiner

*Primary Examiner* — A. M. Thompson

(57) ABSTRACT

A data processing system determines current information corresponding to a node included at a device design. Physical layout information corresponding to the node is received, the physical layout information including one or more layout geometries, the one or more layout geometries providing a circuit network. The circuit network may be partitioned into two or more network segments. A current conducted at a network segment is identified based on the current information. Information representative of dimensions and metal layer of a layout geometry included at the network segment is received. The computer determines that the current exceeds a predetermined maximum threshold, the predetermined maximum threshold determined based on the dimensions and metal layer.

17 Claims, 11 Drawing Sheets

1000

| METAL LEVEL | METAL LENGTH (u) | Idc (mA) @ T1C |
|---|---|---|
| Mx | L2 >= L2 | D0 x (W - BT1) |
| | L1 < L < L2 | (L2/L) D0 x (W - BT1) |
| | L <= L1 | K x D0 x (W - BT1) |
| My | L >= L2 | D1 x (W - BT1) |
| | L1 < L < L2 | (L2/L) D1 x (W - BT1) |
| | L <= L1 | K x D1 x (W - BT1) |
| Mz | L >= L2 | D3 x (W - BT2) |
| | L1 < L < L2 | (L2/L) D3 x (W - BT2) |
| | L <= L1 | K x D3 x (W - BT2) |
| PAD ALUMINUM | ALL | D4 x (W - BT3) |

METHOD AND SYSTEM FOR PHYSICAL VERIFICATION USING NETWORK SEGMENT CURRENT

FIELD OF THE DISCLOSURE

The present disclosure relates generally to integrated circuits, and more particularly design tools for integrated circuits.

BACKGROUND

Because of their complexity, integrated circuits, such as systems on a chip (SOCs), are typically designed using automated design tools, such as a computer-aided design (CAD) system. The CAD system can include automated processes to implement, verify, and improve performance, reliability, and manufacturability of the integrated circuit design. For example, to verify reliability of an integrated circuit design, the CAD system simulates the behavior of the device based on input stimuli and determines whether physical attributes of the device conform to design rule specifications.

BRIEF DESCRIPTION OF THE DRAWINGS

The present disclosure may be better understood, and its numerous features and advantages made apparent to those skilled in the art by referencing the accompanying drawings.

FIG. 10 is a table for identifying electromigration violations in accordance with a specific embodiment of the present disclosure.

DETAILED DESCRIPTION

Figure 1:
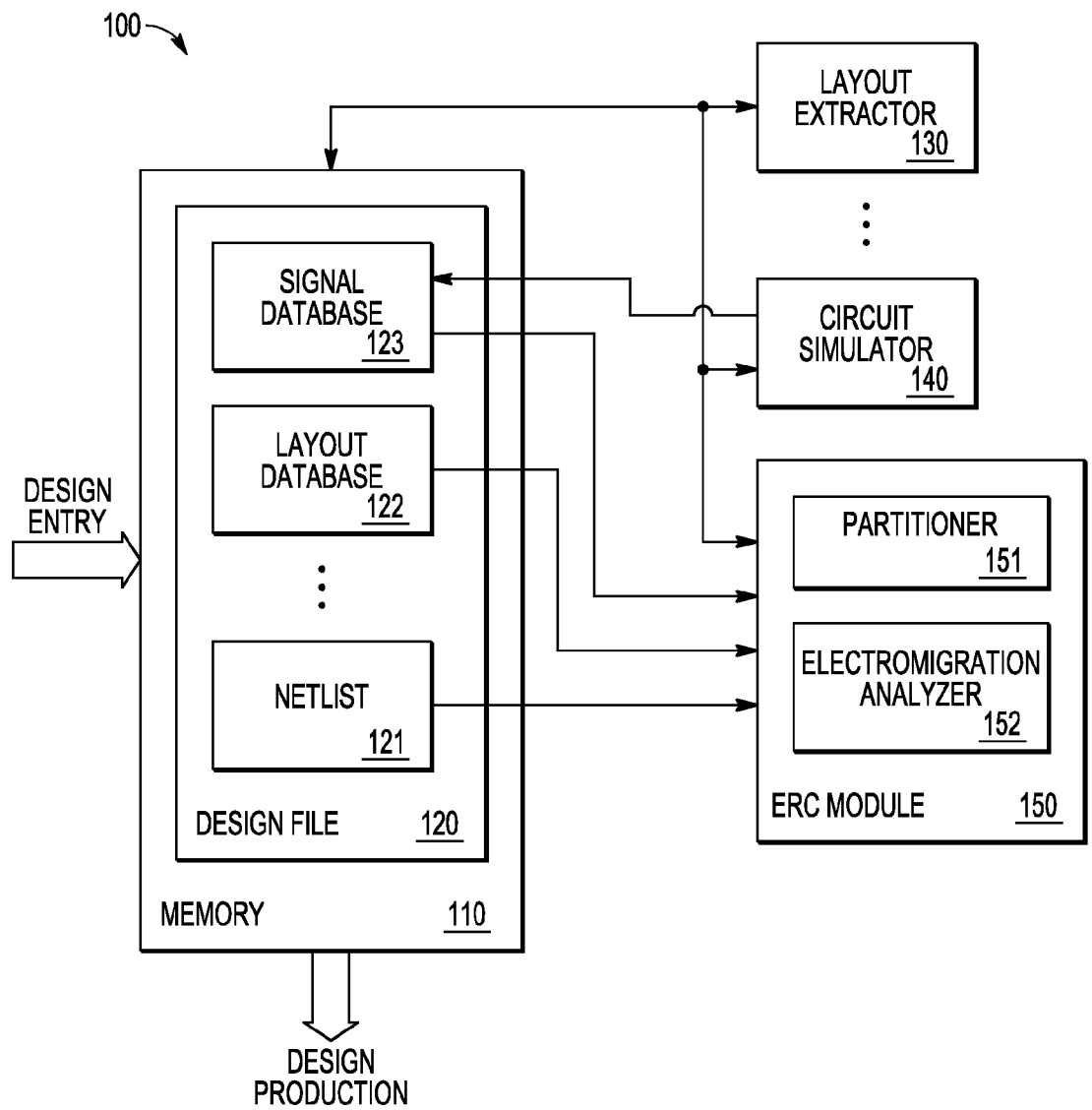
FIG. 1 is a block diagram illustrating an integrated circuit design system including computer-aided design (CAD) application modules in accordance with a specific embodiment of the present disclosure.

FIGS. 1-12 illustrate an integrated circuit design system and techniques for verifying the functionality, reliability, and manufacturability of an integrated circuit. One or more representations of the integrated circuit design can be maintained at a design system. For example, a transistor-level representation of a device design can include a netlist representing how individual transistors that make up the device are interconnected. A physical representation of the device design can include polygonal information corresponding to physical components that make up the device, for example transistor active area, transistor gate elements, metal interconnects, and the like. Other representations of a device design can be maintained to support simulation and analysis of the operation of the device. For example, a device design can include representations associated with functional verification, timing verification, electrical verification, and the like. In an embodiment, a circuit representation of a device design can be analyzed by a circuit simulator to provide signal information corresponding to one or more nodes of the device. The signal information can include voltages, currents, or other signal attributes. As used herein, a node corresponds to an interconnect that communicates information between two or more circuit components. A node also can be referred to as net. The signal interconnect can be implemented using materials including metal, diffusion, poly-silicon, vias, and the like.

A physical layout representation of a node can include a circuit network that can be further partitioned into two or more network segments. In an embodiment, signal information determined by electrical simulation of the device design can be used to determine current flow at each network segment. Current flow at each of the network segments can be evaluated to determine whether a current conducted at a respective network segment of a node exceeds a predetermined maximum threshold, the threshold based on characteristics of the segment, such as dimensions and metal layer of geometries of the segment.

To illustrate, an integrated circuit can include a collection of circuit components and corresponding nodes that couple selected circuit components. A circuit component can include a transistor, a logic gate, an analog circuit module, or another type of active or passive component. During operation of the integrated circuit, the nodes can conduct electrical signals between terminals of corresponding circuit components. If the amount of electrical current conducted by a node exceeds specified design guidelines, the integrated circuit can experience excessive wear that reduces functionality of the device. For example, excessive current density at a particular conductor of a node can result in excessive electromigration of metal atoms that make up the conductor. In another example, excessive currents carried by a conductor can result in heating or undesirable voltage drops that can adversely affect functionality of the integrated circuit. Identifying violations of the design guidelines can be computationally exhausting, and conventional design verification techniques rely on approximations and simplifications to reduce the time required to perform an analysis of a device design.

FIG. 1 is a block diagram illustrating an integrated circuit design system 100 including computer-aided design (CAD) application modules in accordance with a specific embodiment of the present disclosure. The design system 100 is operable to facilitate the design of an integrated circuit. Design system 100 includes a memory 110, a layout extractor 130, a circuit simulator 140, and an electrical rule check (ERC) module 150. The memory 110 includes a design file 120. The design file 120 can maintain a representation of the integrated circuit, which is referred to herein as a device design. For example, the design file 120 can include one or more databases used for storing a representation of a device design and an application programming interface (API) to permit application modules to access and manipulate device design attributes. Further, the design file 120 can represent a device using one or more models and views. For example, the design file 120 can include a netlist 121 that provides a schematic description of the device, a layout database 122 that stores a physical representation of the device, and a signal database 123 for storing current and voltage information provided by the circuit simulator 140. The netlist 121 can include a gate level representation of the device, a transistor level representation of the device, or the like. The design file 120 can include other representations of a device, not shown, such as a register-transfer level (RTL) model, a behavioral model, and the like.

Application modules such as the layout extractor 130, the circuit simulator 140, and the ERC module 150 can include hardware or software modules. The application modules can be configured to manipulate and analyze device design information included at the design file 120 to transform a corresponding representation of the device in a desired way. During the design process, the representation of the device at the design file 120 can change as it evolves and matures. For example, based on simulations of the integrated circuit, the device design can be altered so that the device design complies with a specification. The changes to the device design can be reflected by corresponding changes to the design file 120 that can be evaluated by further simulation and testing. Once the design process is complete, the device design can be used to manufacture the integrated circuit. For example, the layout database 122 can include a representation of an integrated circuit design that includes information relating to physical photo-mask features that can be provided to an integrated circuit manufacturing facility. In one embodiment, the application modules 130, 140, and 150 can include hardware modules, software modules, or a combination thereof. Each application module can be executed as described herein to perform an associated design function. The design system 100 can include additional application modules (not shown at FIG. 1) that are associated with other aspects of the design process. For example, the design system 100 can include a layout verification module operable to identify and validate a correspondence between information included at the netlist 121 and physical information stored at the layout database 122, a static timing analysis module to verify that a device based on the device design can operate at a desired speed, and the like.

The layout extractor 130 is an application module operable to translate physical information stored at the layout database 122 into electrical circuit parameters and circuit components, including capacitance and resistance associated with physical elements of the design. For example, the layout extractor 130 can determine the resistance and capacitance associated with one or more portions of a node, and parasitic capacitances resulting from adjacent circuit features. The layout extractor can include a commercially available extractor, a proprietary extractor, or a combination thereof. Furthermore, the layout extractor 130 can provide highly accurate results based on three-dimensional modeling, or it can provide approximated or estimated results to reduce operational runtime.

The circuit simulator 140 is an application module operable to simulate the electrical operation of a device design represented by the design file 120. For example, the circuit simulator 140 can verify the device will operate at an intended frequency. In addition, the circuit simulator 140 is configured to determine signal information including current and voltage information associated with operation of the device and to store the signal information at the signal database 123 at the design file 120. In an embodiment, the signal information includes an amount of current sinked or sourced through terminals of circuit components and voltage levels at terminals. For example, circuit component terminals can include transistor source/drain terminals and gate terminals, or can include input/output terminals of another device, module, or collection of modules. In an embodiment, a representation of the device provided to the circuit simulator 140 can includes the netlist 121, which is further annotated with electrical circuit parameters provided by the layout extractor 130. The circuit simulator 140 can include a commercially available circuit simulator, such as an HSPICE simulator, a proprietary circuit simulator, or a combination thereof, to simulate the operation of the configuration of circuit components and other modules represented in the design file 120.

The ERC module 150 is an application module operable to determine whether a device design is in compliance with a set of electrical and physical design guidelines. The ERC module 150 receives the current information from the circuit simulator 140 and layout information from the layout database, and determines whether the device design is in compliance with a set of design rules and specifications. The ERC module 150 includes a partitioner 151 and an electromigration analyzer 152. The partitioner 151 receives layout information from the layout database 122. The layout information includes layout geometries associated with nodes of the device design, the layout geometries providing a circuit network that interconnects corresponding circuit components. The partitioner 151 can conditionally partition selected nodes into two or more individual network segments based on predefined partitioning protocols. For example, a node can be partitioned into a plurality of network segments wherein each network segment represents a single metal polygon or a single via. Alternatively, the partitioning may be done based on changes in a dimension, such as width, or notches, turns, bends, and intersections of two or more metal polygons. As used herein, the term via describes an electrically conductive contact used to electrically connect discrete materials, such as different metal layers, semiconductor layers, and the like. The ERC module 150 can include other modules (not shown at FIG. 1) operable to verify that the device represented by the design file 120 satisfies electrical specifications and is compliant with functional, reliability, and manufacturing guidelines. The operation of the partitioner 151 can be better understood with reference to FIG. 2 and FIG. 3.

Figure 2:
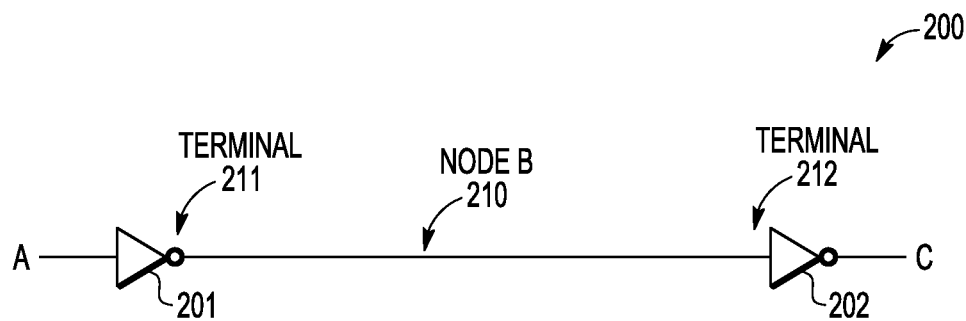
FIG. 2 is a schematic diagram illustrating a logic netlist view of a portion of a device design in accordance with a specific embodiment of the present disclosure.

FIG. 2 is a schematic diagram illustrating a portion 200 of a device design in accordance with a specific embodiment of the present disclosure. The portion 200 includes an inverter 201 having an input connected to a node A, and an output connected to a node 210 labeled B. A second inverter 202 has an input connected to the node B and an output connected to a node C. Therefore, node B provides a signal interconnect for conducting signals from an output terminal 211 of the inverter 201 to an input terminal 212 of the inverter 202. A representation of the portion 200 and other portions of the device design can be stored at the netlist 121 of FIG. 1.

Figure 3:
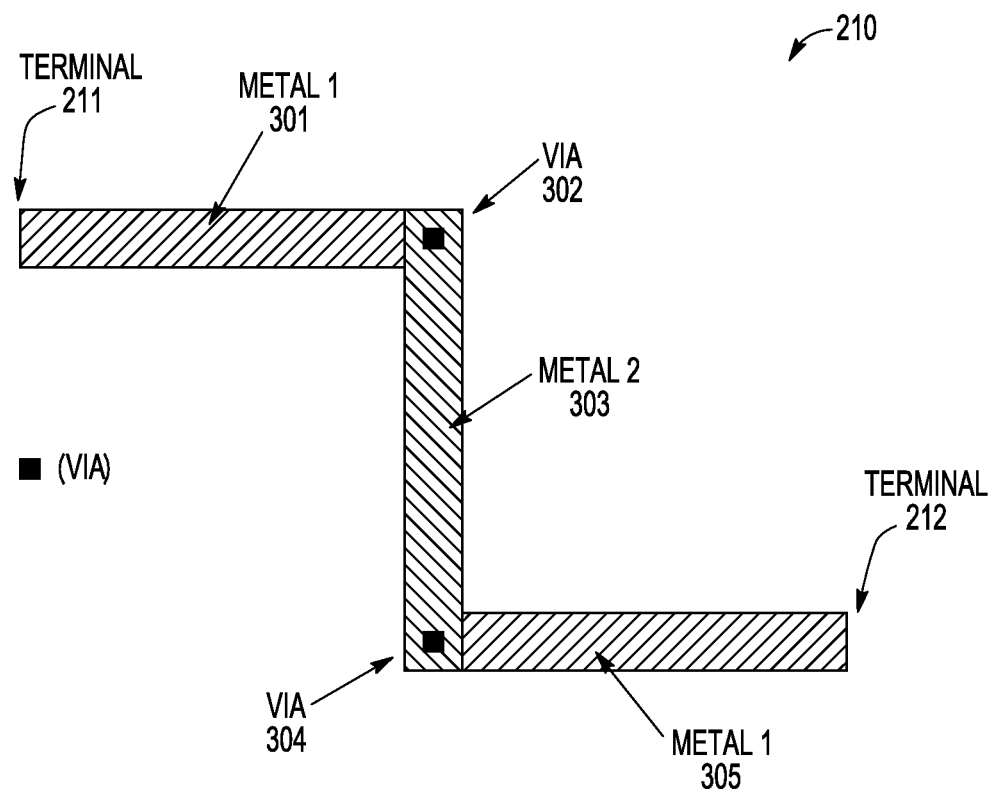
FIG. 3 is a layout view illustrating a circuit node of FIG. 2 in accordance with a specific embodiment of the present disclosure.

FIG. 3 is a layout view illustrating the node B 210 of FIG. 2 in accordance with a specific embodiment of the present disclosure. The node B is implemented by three metal polygons 301, 303, and 305 formed at two or more conductive layers connected in series by vias 302 and 304 formed between conductive layers. Vias are conductive materials that provide electrical contact between disparate physical features. Together, the metal polygons and vias that implement the node B provide a circuit network for conducting signals from terminal 211 to terminal 212. For clarity, connections from terminal 211 to the output portion of inverter 201 and from terminal 212 to the input portion of inverter 202 are not shown. The layout information associated with node B and other portions of the device design can be stored at the layout database 122 of FIG. 1. Various application modules can generate, manipulate, and analyze the layout information. For example, a router application (not shown at FIG. 1) can synthesize the physical features of node B based on connectivity information provided by the netlist 121 and based on routing and obstruction-avoidance algorithms, while maintaining compliance with pertinent design rules.

The partitioner 151 is operable to partition the circuit network corresponding to node B into a plurality of network segments. For example, the partitioner 151 can partition node B into five discrete network segments corresponding to each of the metal polygons and via objects, 301-305. Note that the partitioning operation performed by the partitioner 151 does not affect the corresponding layout physical information, but rather provides an additional design representation of the layout information. The partitioner 151 operates based on a predetermined partitioning protocol. In an embodiment, an interconnect node can be divided into discrete segments based on algorithms that take into account how current will be conducted at specific portions of the node. For example, node B can be partitioned into five network segments (301-305) based on determining that the current carrying capabilities of each segment is different than that of an adjacent segment. Portions of a node adjacent to a branch are typically segregated because signal current can merge or divide at such a structure.

The partitioner 151 can partition a node based on another partitioning protocol, wherein node B can be partitioned into a greater or a fewer number of network segments. For example, in the event that node B were implemented as a single complex polygon of metal at a single metal layer that includes two ninety degree bends (and thus having a footprint similar to the route illustrated at FIG. 3), the partitioner 151 can be configured to partition node B into five network segments including the individual rectilinear metal polygons representing straight portions of the interconnect and two portions representing the ninety degree bend portions of the interconnect. In an embodiment, layout geometries that introduce current crowding can be isolated to an individual partition, for example, a bend in a route at a single metal layer or a constriction in the width of a route. In another embodiment, features exhibiting a predetermined degree of dimensional inhomogeneity can be isolated to an individual partition.

Figure 4:
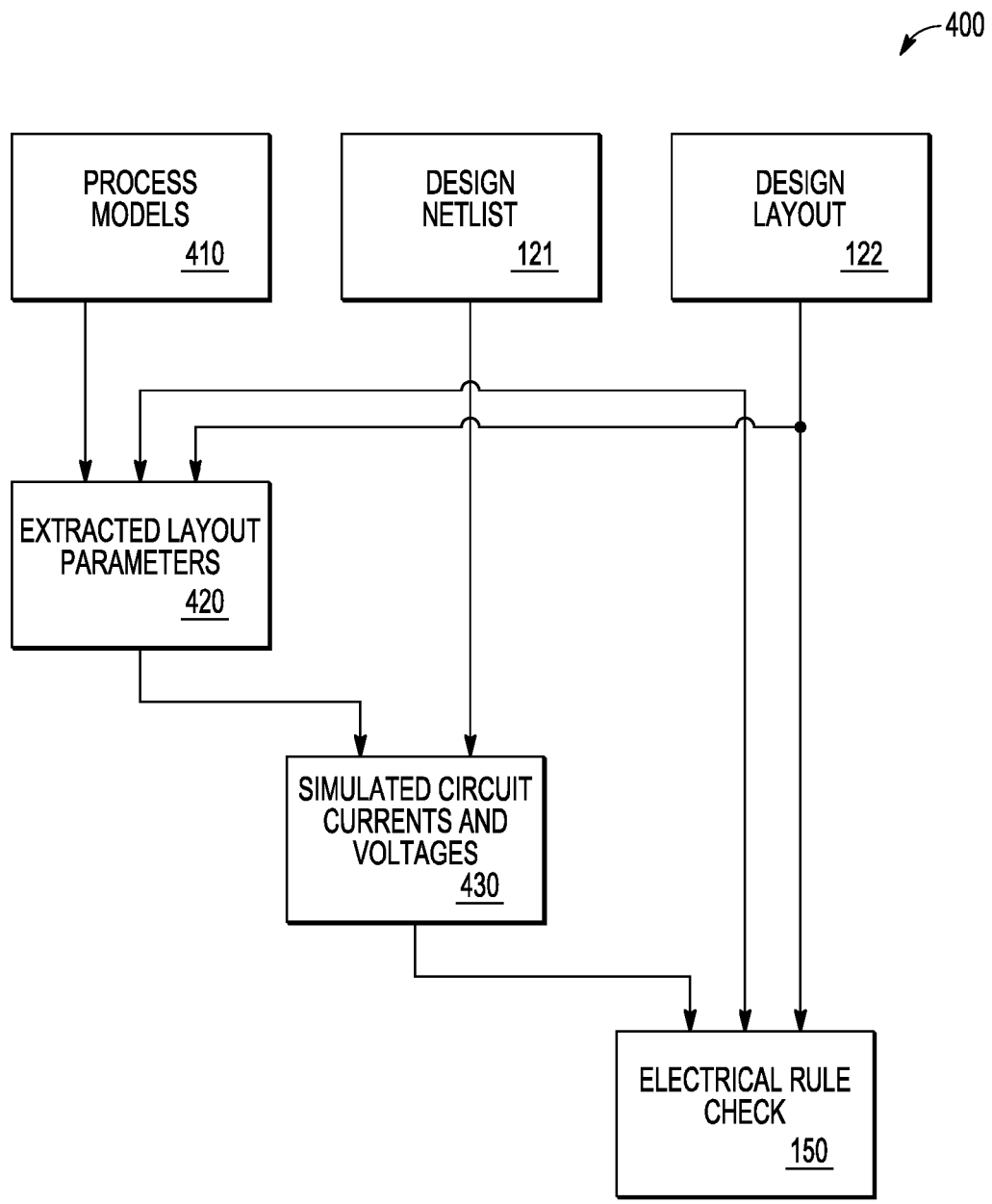
FIG. 4 is a data flow diagram illustrating operation of the integrated circuit design system of FIG. 1 in accordance with a specific embodiment of the present disclosure.

FIG. 4 is a data flow diagram 400 illustrating how application modules included at the integrated circuit design system 100 can manipulate and provide design information suitable for performing an electrical rule check in accordance with a specific embodiment of the present disclosure. The layout extractor 130 can receive process models 410, design information maintained at the layout database 122, and optionally the netlist 121 and determine extracted layout parameters 420. The extracted layout parameters 420 include capacitance and resistance information corresponding to individual devices and interconnect elements that make up the device. In one embodiment, the layout extractor 130 generates a simulator-ready netlist, which provides a complete representation of a device design, or a portion thereof. In another embodiment, the layout extractor 130 provides extracted electrical parameters that can be annotated to device nodes included at the netlist 121.

The extracted layout parameters 420 (or the netlist 121 annotated with the extracted parameters) can be provided to the circuit simulator 140. The extraction can be performed at various levels of abstraction and granularity to optimize either accuracy or run time performance. The circuit simulator 140 simulates the operation of the device design and provides signal information including source currents and sink voltages 430 associated with selected circuit components. The signal information can be stored at the signal database 123. For example, the circuit simulator can determine source currents provided at the outputs of circuit components that provide a signal to a circuit node (such as the output of inverter 201 of FIG. 2), and sink voltages received at inputs of circuit components that receive signals conducted by a circuit node (such as the input of inverter 202 of FIG. 2). The signal information stored at the signal database 123, physical information stored at the layout database 122, and the netlist 121 are provided to the ERC module 150, which can verify the operational integrity of a device design based on the device design information. The operation of the ERC module 150 will be better understood with reference to FIGS. 5-10.

Figure 5:
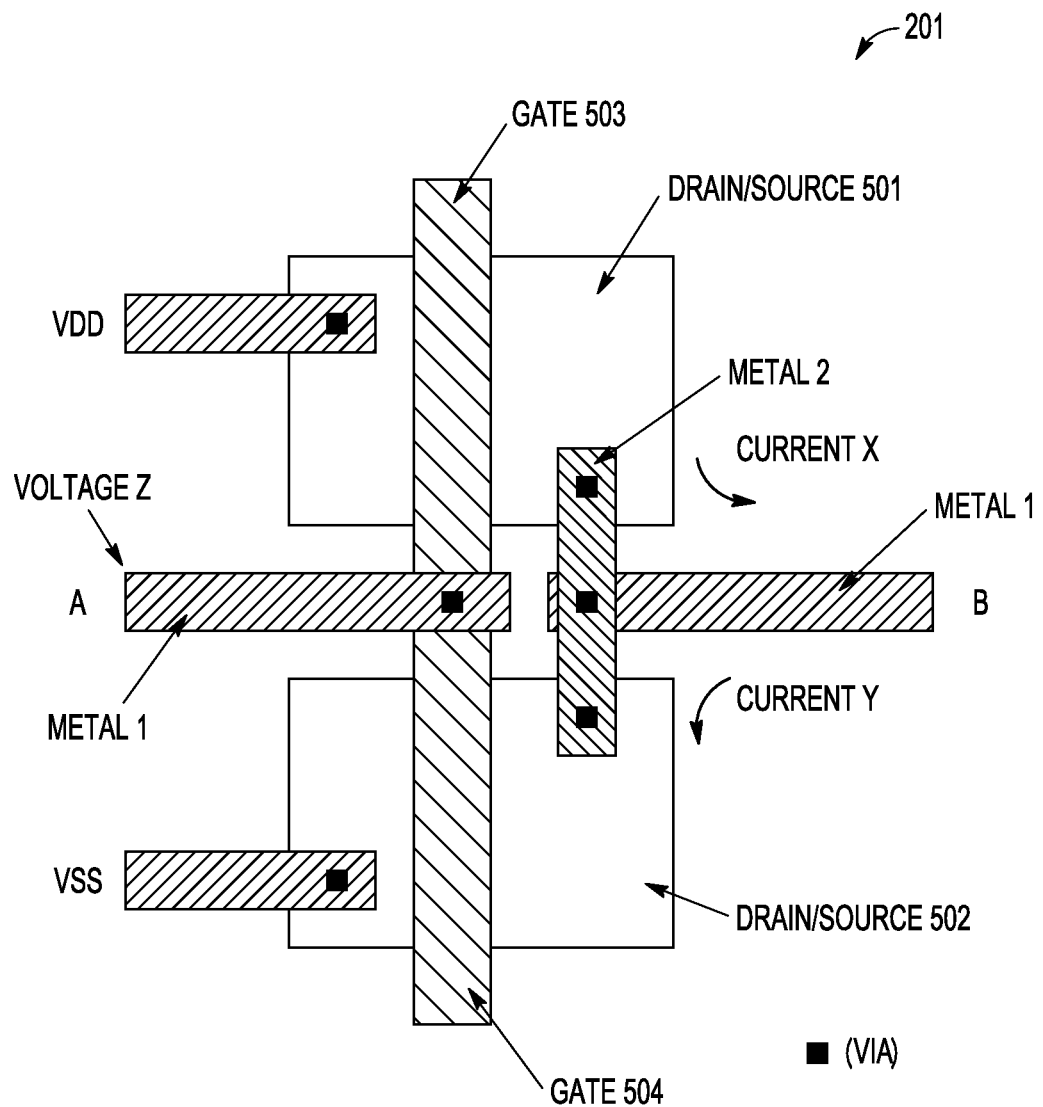
FIG. 5 is a layout view of an inverter of FIG. 2 in accordance with a specific embodiment of the present disclosure.

FIG. 5 is a layout view of the inverter 201 of FIG. 2 in accordance with a specific embodiment of the present disclosure. The inverter 201 is a complementary metal oxide semiconductor (CMOS) device and includes a P-channel transistor implemented by a drain/source region 501 and a gate 503, and an N-channel transistor implemented by a drain/source region 502 and a gate 504. The source of the drain/source 501 is connected to a first reference voltage VDD by a metal conductor, and the drain of the source/drain 502 is connected to a second reference voltage VSS by another metal conductor. The gate 503 and the gate 504 are connected to the node A by a metal conductor configured to receive an input signal. The drain of drain/source 501 and the source of drain/source 502 are connected by a metal conductor and together provide an output for providing a signal to the node B.

During operation, the inverter 201 is capable of performing a logical negation operation. For example, a signal received at node A can transition from a voltage corresponding to a logic-high state and a voltage corresponding to a logic-low state. In response, the P-channel transistor is configured to conduct and the N-channel transistor is deactivated, causing a source current X to charge a capacitance associated with the node B, and thus causing a voltage at the node B to transition from a logic-low state to a logic-high state. At another time, a signal received at node A can transition from a voltage corresponding to a logic-low state and a voltage corresponding to a logic-high state. In response, the P-channel transistor is deactivated and the N-channel transistor is configured to conduct, discharging the capacitance associated with the node B, and thus causing a voltage at the node B to transition from a logic-high state to a logic-low state.

The circuit simulator 140 is configured to simulate the operation of a circuit including the inverter 201 and collect signal information associated with the node A and the node B. For example, the circuit simulator 140 can determine a magnitude of the current X and of the current Y, as well as voltages at circuit nodes, such as a sink voltage Z at node A. In an embodiment, the circuit simulator 140 can calculate and store a maximum current associated with each current source realized over time in response to simulated operation of the device design, or a portion thereof. In another embodiment, the circuit simulator can calculate and store a representation of an RMS current, and RMS voltage, or other signal parameters. As illustrated at FIG. 5, a single output terminal can be associated with more than one source current. Note that the direction of current conducted at the node B is different depending on whether the node B is transitioning to a logic-high state or to a logic-low state. For simplicity, the sink voltage Z is shown at the input of the inverter 201 at node A, however it will be appreciated that corresponding sink voltages can be determined at inputs of other circuit components, for example, at inputs to circuit components that receive signals from the node B.

The circuit simulator 140 can simulate the operation of a circuit using comprehensive and detailed design information or based on estimated or approximated information. Furthermore, a simulation algorithm utilized by the circuit simulator can range from a highly-accurate simulation algorithm to less-accurate, but time-efficient, algorithms. The accuracy of simulated source currents and sink voltages can be increased if the circuit representation being simulated includes parasitic resistance and capacitance information corresponding to signal interconnects and other circuit components. In an embodiment, the circuit simulator can include HSPICE. For example, the node B connecting the output of the inverter 201 to the input of the inverter 202 can include a long circuitous route having significant capacitance and/or significant resistance, which can increase or decrease a maximum current supplied by a current source, such as the current source X. The circuit simulator can be provided with stimulus information corresponding to inputs of a device design that is being simulated. The stimulus information can include estimations of probable input stimuli, or can include highly accurate stimuli provided by the simulation of functional or logic models of the device design. The circuit simulator 140 can determine signal information corresponding to one or more modes of operation of a device and corresponding to one or more operating conditions. For example, the circuit simulator 140 can characterize the operation of a device design that is operating at various supply voltages, temperatures, frequencies, and the like.

Figure 6:
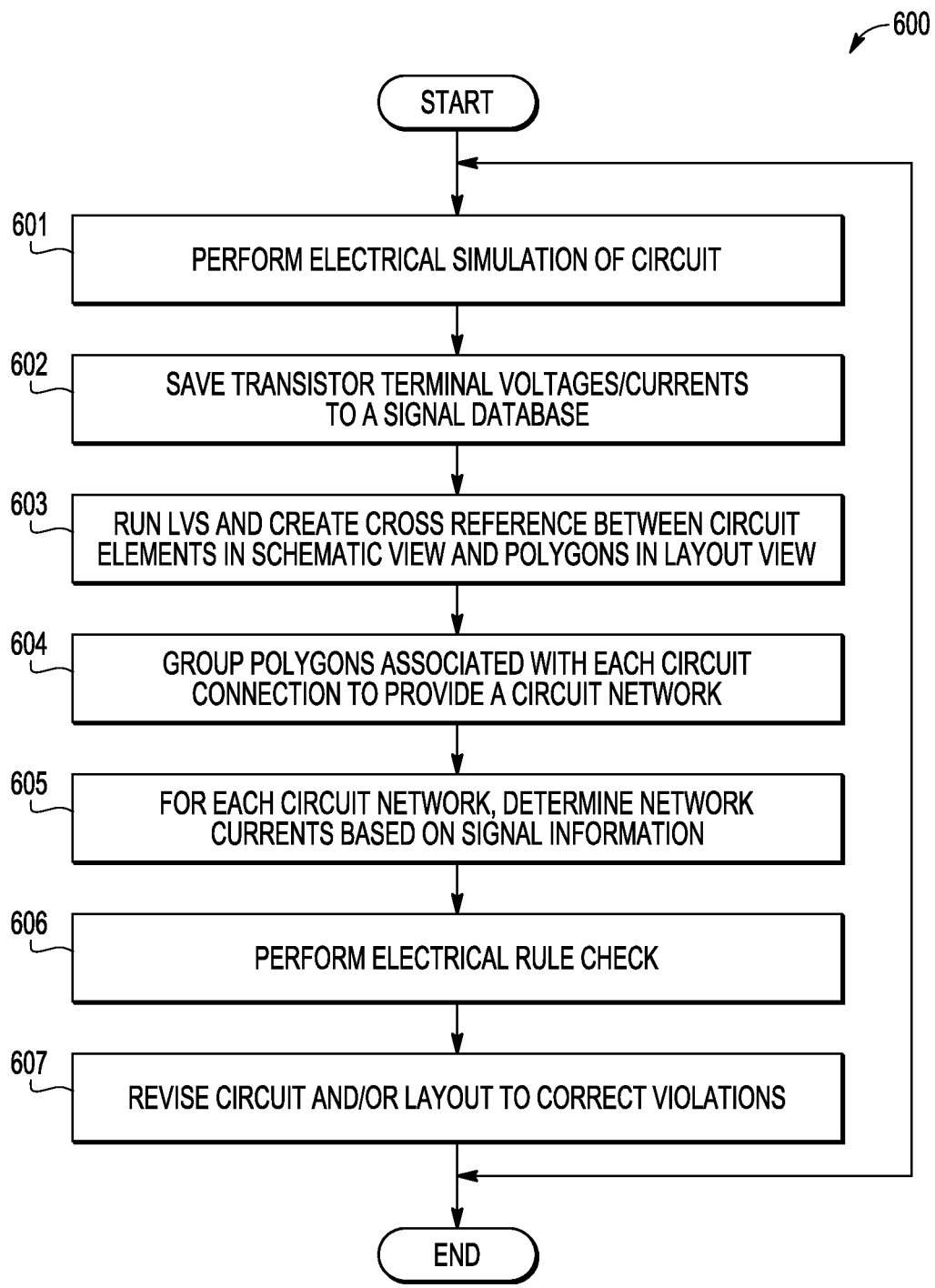
FIG. 6 is a flow diagram illustrating a method for performing an electrical rule check of a device design in accordance with a specific embodiment of the present disclosure.

FIG. 6 is a flow diagram illustrating a method 600 for performing an electrical rule check of a device design in accordance with a specific embodiment of the present disclosure. The method 600 begins at block 601 where an electrical simulation of a device design is performed. For example, the circuit simulator 140 can simulate the operation of a device design based on the netlist 121 and, optionally, electrical parameters determined by the layout extractor 130. The flow proceeds to block 602 where signal information associated with terminals of circuit components is stored at the signal database 123. For example, source currents and sink voltages associated with each component terminal of a device can be determined based on anticipated or worst-case operating conditions for the device. The flow proceeds to block 603 where a layout versus schematic (LVS) application program can be used to create a cross reference between circuit components included at a schematic view of the device design and polygons included at a layout view of the design. For example, an LVS program can identify a correspondence between transistors and nodes specified by the netlist 121 and physical structures included at the layout database 122.

The flow proceeds to block 604 where polygons associated with each circuit connection are grouped together to provide a complete circuit network. For example, a single node at the netlist 121 can be implemented using more than one layout polygon representing multiple metal layers, vias, connections to transistor fingers, signal branches, parallel connections, and the like. The flow proceeds to block 605 where, for each circuit network, a geometry engine calculates currents conducted at each branch of the circuit network. For example, signal information including current sources and sink voltages stored at the signal database can be retrieved and used to simulate how electrical current is conducted and distributed throughout a circuit interconnect. The flow proceeds to block 606 where one or more electrical rule checks are performed on each circuit interconnect based on the network currents. In an embodiment, the electrical rule check identifies electromigration violations. The operation of the ERC module 150 can be better understood with reference to FIG. 7 below. The flow proceeds to block 607 where a device design can be revised to correct for violations identified by the electrical rule check. For example, circuit and/or layout features can be modified to correct a design rule violation.

Figure 7:
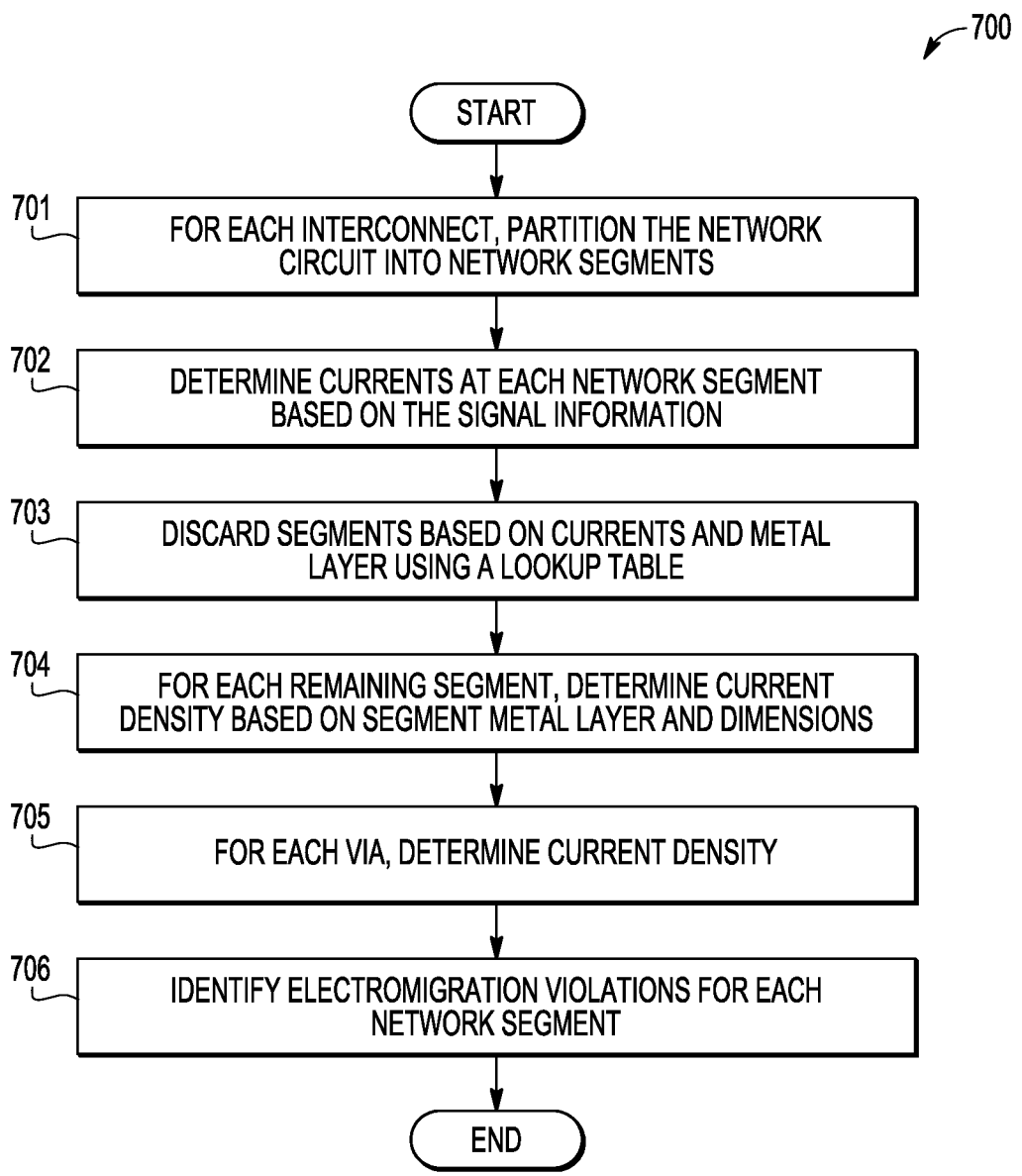
FIG. 7 is a flow diagram illustrating a method for performing the electrical rule check of FIG. 6 in accordance with a specific embodiment of the present disclosure.

FIG. 7 is a flow diagram illustrating a method 700 for performing the electrical rule check of FIG. 6 in accordance with a specific embodiment of the present disclosure. The method 700 can correspond to block 606 of FIG. 6. The method 700 begins at block 701 where, for each interconnect of the device design, a corresponding network circuit is partitioned into one or more network segments. For example, a network circuit can be divided into multiple network segments in response to identifying physical features of the interconnect that introduce inhomogeneity or otherwise constrict or distribute currents conducted at various portions of the interconnect. The partitioning operation can be better understood with reference to FIGS. 8 and 9 below. Following the partitioning, a resistance of each network segment is computed. The flow proceeds to block 702 where currents corresponding to each network segment are determined based on the signal information associated with each interconnect. For example, source currents and sink voltages associated with each interconnect can be used to simulate how current is distributed at various features of an interconnect.

The flow proceeds to block 703 where individual network segments are discarded based on currents conducted by the segment and based on a metal layer or other physical attribute of the segment. For example, the ERC module 150 can determine that a current conducted at a particular network segment is too small to result in electromigration at that segment. In an embodiment, the discarding process is not based on the width of a metal used to implement a metal segment and is described below with reference to FIG. 10. A similar discarding process can be applied for vias as well. The flow proceeds to block 704 where a current density is determined for each network segment that was not discarded at block 703, the current density determined based on the dimensions of the features included at the segment and based on a metal layer used to implement the features. In an embodiment, violation of electromigration design rules is determined based on a length and a width of a metal feature and the current conducted by the metal feature. The flow proceeds to block 705 where a current density associated with each via is determined. Generally, each via constitutes a unique network segment. The flow proceeds to block 706 where network segments having electromigration violations are identified. The partitioning of an interconnect network can be better understood with reference to FIGS. 8 and 9.

Figure 8:
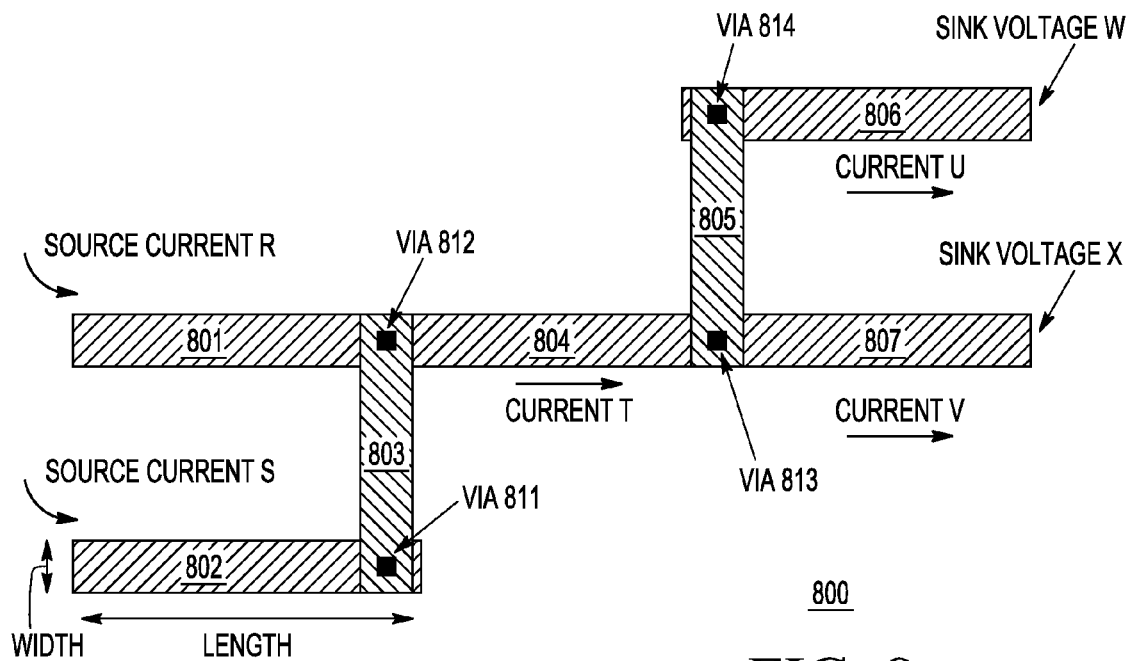
FIG. 8 is a layout view of a node in accordance with a specific embodiment of the present disclosure.

FIG. 8 is a layout view of a node 800 in accordance with a specific embodiment of the present disclosure. Node 800 represents an interconnect for conducting signals from two circuit element outputs to two circuit element inputs. The node 800 includes five polygons, each polygon representing one of two metal layers. The five metal layer features are interconnected by vias 811, 812, 813, and 814, resulting in seven individual metal segments, 801, 802, 803, 804, 805, 806, and 807. A first circuit element provides a source current R to the metal segment 801, a second circuit element provides a source current S to the metal segment 802. The metal segment 803 connects the segment 802 with the segment 801 using the vias 811 and 812, respectively. Thus, current conducted at the segment 801 and current conducted by the segments 802 and 803 are combined and represented by current T, conducted at the metal segment 804. The via 813 introduces a branch wherein the current T is divided into two portions. A first portion, represented by sink current U, is conducted by the metal segment 805, the via 814, and the metal segment 806, while a second portion, represented by sink current V, is conducted by the metal segment 807. For simplicity, connections to circuit components at the source and sink terminals of the node are not shown. Physical layout information associated with a device design, such as information describing the node 800, can be stored at the layout database 122. The physical layout information includes dimensions of each layout feature, such as the length and width of each metal segment, as illustrated with reference to the metal segment 802. The ERC module 150 can verify the electrical integrity of a device design using layout information from the layout database 122 and signal information from the signal database 123.

In an embodiment, the vias 811-814 introduce boundary features at which the node 800 can be partitioned into individual network segments. For example, each of metal segments 801-807 and each of vias 811-814 can be partitioned into unique individual network segments. One skilled in the art will appreciate that the node 800 can be partitioned into a fewer or into a greater number of portions based on an alternative partitioning protocol.

Figure 9:
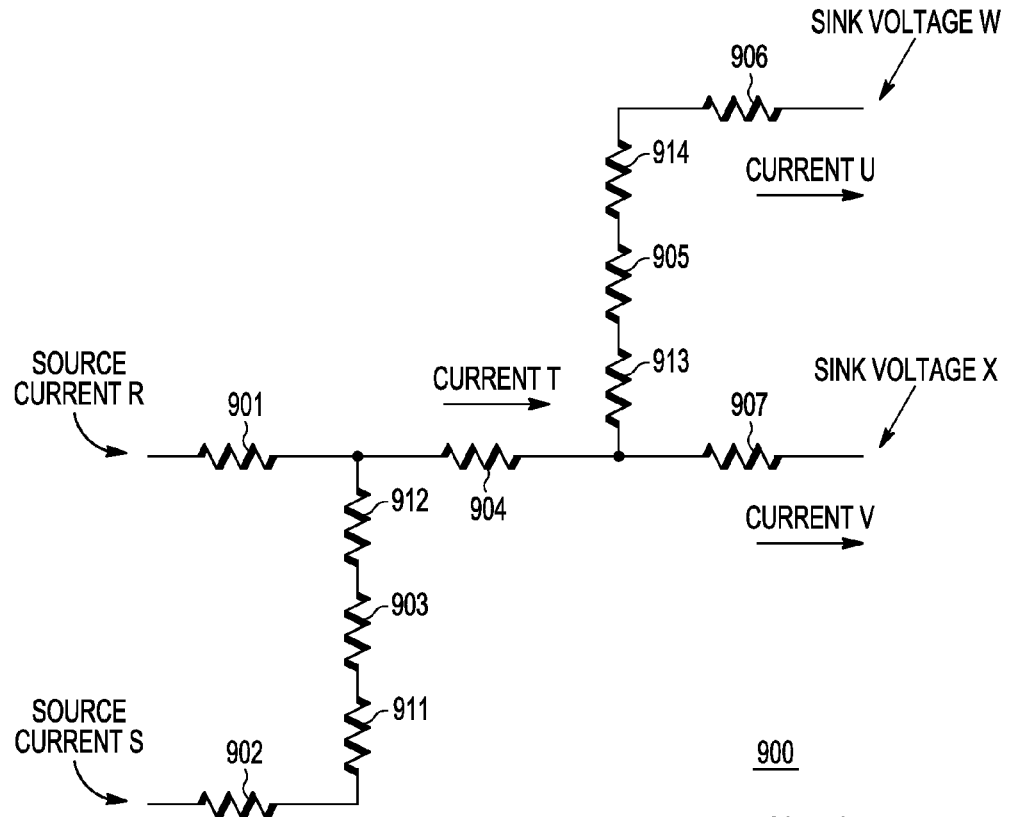
FIG. 9 is a schematic view of a circuit network corresponding to the node of FIG. 8 in accordance with a specific embodiment of the present disclosure.

FIG. 9 is a schematic view of a circuit network 900 corresponding to the node 800 of FIG. 8 in accordance with a specific embodiment of the present disclosure. The circuit network 900 includes resistors 901, 902, 903, 904, 905, 906, 907, 911, 912, 913, and 914. In particular, each of metal segments 801-807 and each of vias 811-814 are represented by a corresponding resistor. For example, metal segment 801 is represented by the resistor 901, via 811 is represented by the resistor 911, and so on. The ERC module 150 can receive physical information from the layout database 122 and signal information from the signal database 123. The electromigration analyzer 152 can use a circuit simulator, such as the circuit simulator 140 to determine an amount of current flowing through each of the resistors in response to the source current R, the source current S, the sink voltage W, and the sink voltage X. Because each resistor corresponds to an individual network segment, a current conducted by each network segment is known.

The electromigration analyzer 152 is configured to determine whether excessive current is conducted at each network segment based on the dimensions of features that make up the network segment. For example, as illustrated at FIG. 8, the metal segment 804 conducts a current T. The layout database 122 includes dimensional information associated with the metal segment 804, including a width of the metal route and information identifying the metal level used to implement the metal segment 804. A current density at the metal segment 804 is a function of the cross sectional area of the metal segment and the current conducted by the segment. The cross sectional area of a metal segment can be determined by multiplying the width of the metal segment by the thickness of the metal, the thickness generally related to the metal level used to implement the segment. Excessive current density at a conductor can increase the rate at which electromigration can occur, possibly limiting the operational lifetime of the device. An amount of electromigration that can occur in a metal conductor is also dependent on the length of a metal segment. The width and length of each metal segment can be stored at the layout database 122. Electromigration design rules can be expressed as a maximum current density that can be supported by a metal interconnect having a particular length. In an embodiment, a lookup table can be used to improve the runtime efficiency of the electromigration analyzer 152.

FIG. 10 is a table 1000 for identifying electromigration violations in accordance with a specific embodiment of the present disclosure. The table 1000 can be used to discard segments (block 703 of FIG. 7) and to identify electromigration violations (block 706 of FIG. 7). The table 1000 includes columns 1001, 1002, and 1003. The column 1001 includes a selection of metal levels for example, a metal level $M_X$, a metal level $M_Y$, a metal level $M_Z$, and a metal level Pad Aluminum. The column 1002 corresponds to particular ranges of metal segment length. The column 1003 provides equations for determining a maximum current that is permitted to be carried by a metal segment based on a current density, a width of the metal, and optionally a thickness of a barrier layer. Each row of table 1000 corresponds to a unique combination of metal level and segment length. For example, rows 1010, 1011, and 1012 are associated with a metal level $M_X$, where row 1010 corresponds to a metal segment having a length greater than or equal to a predetermined length L2, row 1011 corresponds to a metal segment having a length greater than a predetermined length L1 and less than the length L2, and row 1012 corresponds to a metal segment having a length less than or equal to the length L1. Rows 1013, 1014, and 1015 are associated with a metal level $M_Y$ and a respective length, rows 1016, 1017, and 1018 are associated with a metal level $M_Z$, and row 1019 is associated with aluminum metal used for implementing a bonding pad of a predetermined fixed size.

A maximum permissible current that can be carried by a metal segment of a particular level and length is specified by an equation at each respective row. For example with reference to row 1010, a metal segment implemented using metal level $M_X$ and having a length greater than or equal to the length L2, a maximum current that can be conducted by the segment without experiencing excessive electromigration is provided by the equation:

$$D0 \times (W - BT1)$$

where D0 is a current per unit width, W is the length of the metal segment, and BT1 is a barrier thickness associated with metal level $M_X$. A barrier layer associated with the integrated circuit fabrication process causes the final effective electrical width of a metal line to be less than the drawn dimensions specified in the layout database 122, and this phenomenon is corrected for by each equation. Current per unit width (D0, D1, D2, D3, and D4) can vary based on metal level. An amount of current that can be reliably carried by a network segment can be dependent on the length of the segment. For example, a segment having a length that is less than a value L2 may reliably conduct more current than a segment whose length is greater than the value L2. The value K at row 1012 can be a constant having a predetermined value that is greater than one.

Electromigration analyzer 152 can determine an amount of current carried by a metal segment as described above, and compare this value to a maximum allowed current determined using the table 1000. If the current determined by the electromigration analyzer exceeds the current specified by the table 1000, the particular metal segment is considered in violation of the electromigration design rule, and the design can be modified to correct the violation. For example, the width of the metal segment can be increased; another metal level can be substituted for the existing level; circuit components can be modified to reduce the amount of current conducted by the segment; or another remedy can be implemented.

As shown at the table 1000, a maximum allowed current that can be conducted by a particular metal segment is dependent on a respective length of the segment. In particular, a segment having a length that is less than a predetermined value may be capable of conducting a greater amount of current than a segment having a length that is longer than this value. This is due to a physical phenomenon known as the Blech effect. The column 1002 specifies various ranges of segment length and thereby allows the electromigration analyzer 152 to select a suitable equation from the equations at the column 1003 based on the length of a particular segment.

The table 1000 also can be used to discard metal segments from further consideration based on determining that the current conducted by a segment is less than an amount of current that can permissibly be conducted by a wire that is longer than the length L2 as determined by the table, while assuming the width of the segment is equal to a minimum width design rule corresponding to the particular metal level of the segment. Rows 1010, 1013, 1016, and 1019 of the table correspond to metal segments having a length greater than or equal to the length L2, and are therefore capable of safely conducting the least amount of current for a particular segment width. For example, with regard to a metal segment of level $M_X$, the equation provided at the row 1010 reduces to:

$$Idc=\min=D0 \times (W\min - BT1)$$

where the value Wmin corresponds to a minimum (design rule legal) width for a respective metal level. Therefore, if a current conducted by a segment is less than the amount Idcmin, the segment will not violate an electromigration rule, no matter what the actual dimensions of the segment may be. In an embodiment, a corresponding width of each network segments can be considered when determining whether to discard a particular network segment.

During operation, the electromigration analyzer 152 can use a circuit simulator to determine an amount of current that is conducted by a particular metal segment. The electromigration analyzer 152 can determine whether the current carried by the segment can possibly exceed a maximum current specified by an electromigration design rule without considering the actual length and width of the segment (for example, without obtaining physical dimensions of the segment from the layout database 122).

In some instances, devices that are being designed using the integrated circuit design system 100 may be too large to process and analyze as a single entity. Therefore, a device design can be divided into individual portions, each portion of a manageable size. In an embodiment, the individual portions can be configured in a hierarchical manner, and application modules such as the layout extractor 130 and the circuit simulator 140 operate on each portion separately or can operate on a group of portions simultaneously. Information associated with each portion can be stored in a manner that facilitates subsequent analysis of selected portions of the device design, or of the device design in its entirety.

Figure 11:
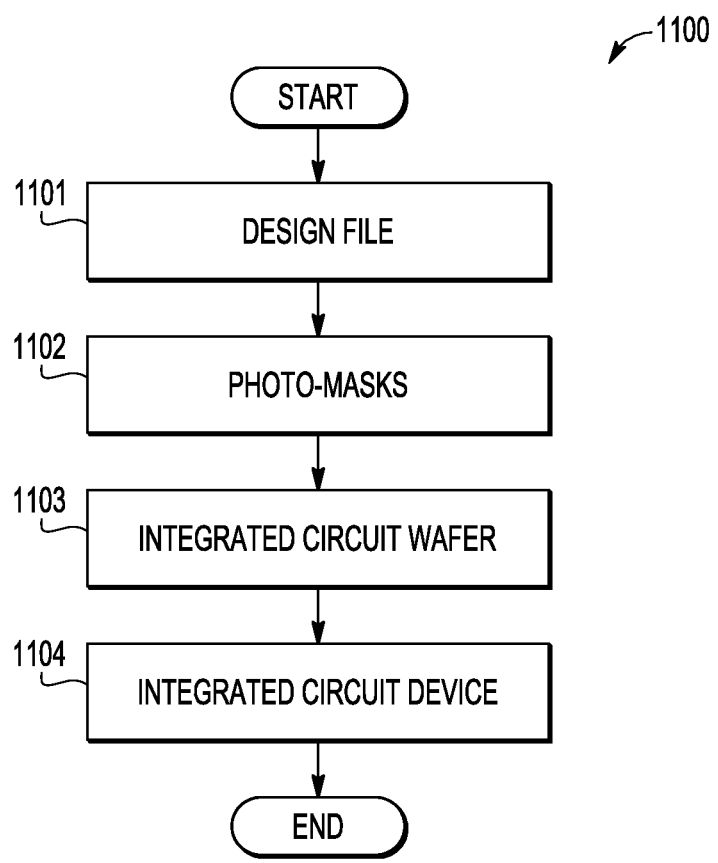
FIG. 11 is a flow diagram illustrating another method in accordance with a specific embodiment of the present disclosure.

FIG. 11 is a flow diagram illustrating another method 1100 in accordance with a specific embodiment of the present disclosure. At block 1101 information included at a design file, such as design file 120, is provided to a photo-lithography facility. For example, design file 120 can include information representing features of the completed integrated circuit such as the location of drain/source areas of transistors, interconnect metallization, and the like. The flow proceeds to block 1102 where photo-masks are manufactured and provided to an integrated circuit wafer-fabrication facility. The flow proceeds to block 1103 where an integrated circuit wafer is manufactured using the photo-masks. The flow proceeds to block 1104 where integrated circuit devices are manufactured from integrated circuit die included at the integrated circuit wafer.

Figure 12:
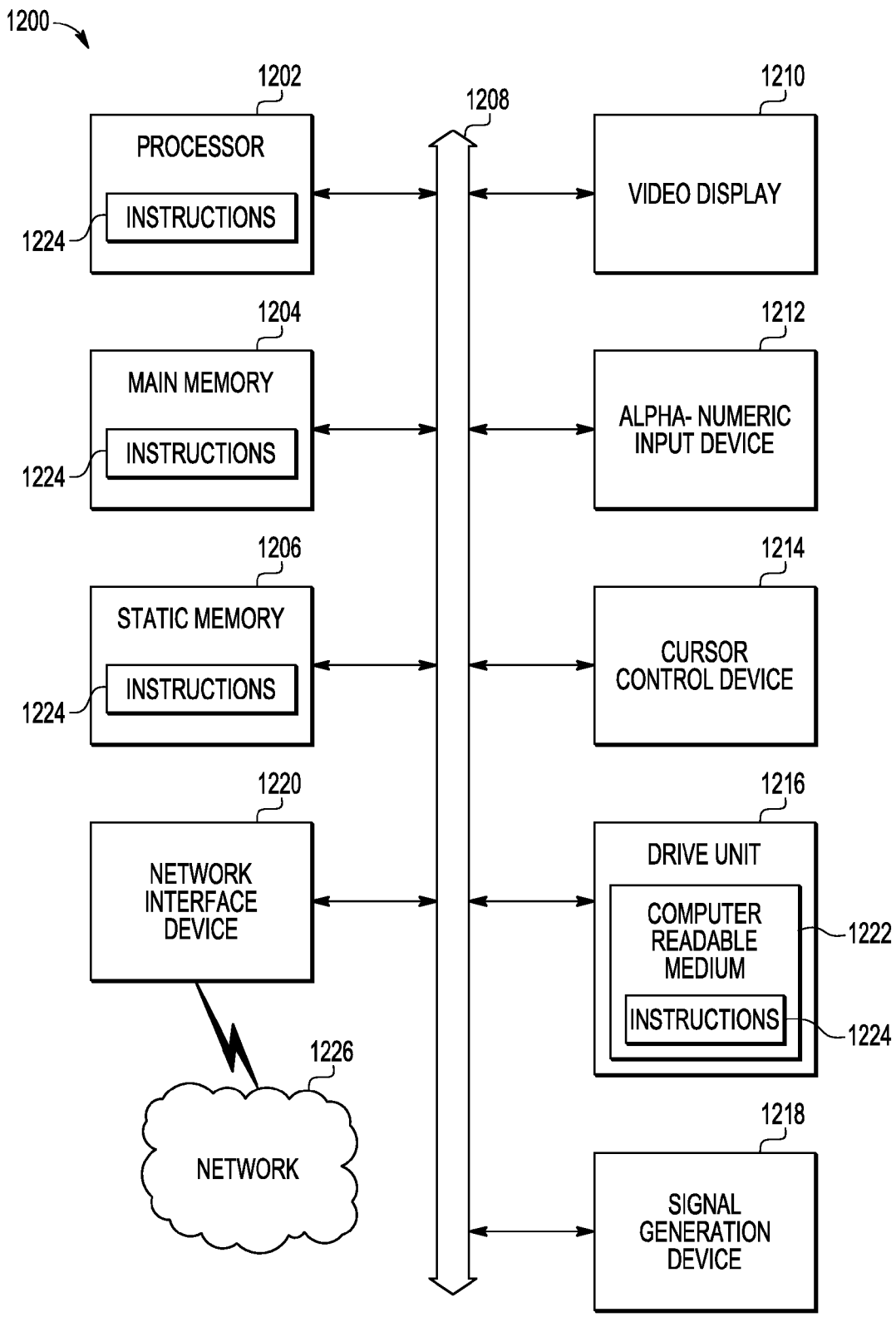
FIG. 12 is a block diagram of a processing system in accordance with at least one embodiment of the present disclosure.

FIG. 12 is a block diagram of a data processing system 1200 in accordance with at least one embodiment of the present disclosure. The processing system 1200 can include a set of instructions that can be executed to manipulate the processing system 1200 to perform any one or more of the methods or functions disclosed above. The processing system 1200 may operate as a standalone device or may be connected, e.g., using a network, to other processing systems or peripheral devices.

In a networked deployment, the processing system may operate in the capacity of a server or as a client user computer in a server-client user network environment, or as a peer processing system in a peer-to-peer (or distributed) network environment. Further, while a single processing system 1200 is illustrated, the term "system" shall also be taken to include any collection of systems or sub-systems that individually or jointly execute a set, or multiple sets, of instructions to perform one or more computer functions.

The processing system 1200 may include one or more processors 1202, e.g., a central processing unit (CPU), a graphics processing unit (GPU), or both. Moreover, the processing system 1200 can include a main memory 1204 and a static memory 1206 that can communicate with each other via a bus 1208. As shown, the processing system 1200 may further include a video display unit 1210, such as a liquid crystal display (LCD), an organic light emitting diode (OLED), a flat panel display, a solid state display, or a cathode ray tube (CRT). Additionally, the processing system 1200 may include an input device 1212, such as a keyboard, and a cursor control device 1214, such as a mouse. The processing system 1200 can also include a disk drive unit 1216, a signal generation device 1218, such as a speaker, and a network interface device 1220.

In a particular embodiment, as depicted in FIG. 12, the disk drive unit 1216 may include a computer readable medium 1222 in which one or more sets of instructions 1224, e.g. software, can be embedded. Further, the instructions 1224 may embody one or more of the methods or logic as described herein. In a particular embodiment, the instructions 1224 may reside completely, or at least partially, within the main memory 1204, the static memory 1206, and/or within the processor 1202 during execution by the processing system 1200. The main memory 1204 and the processor 1202 also may include computer readable media. The network interface device 1220 can provide connectivity to a network 1226, e.g., a wide area network (WAN), a local area network (LAN), or other network.

In accordance with various embodiments of the present disclosure, the methods described herein may be implemented, in whole or in part, by software programs executable by the processing system 1200. The present disclosure contemplates a computer readable storage device (e.g., the main memory 1204, the static memory 1206, or the drive unit 1216) that includes instructions 1224 or receives and provides instructions 1224 for execution. Further data representative of a device design can be stored in one or more of the computer readable storage devices for access by the processing system 1200 during execution of the instructions 1224 so as to implement the methods described above.

Figure 13:
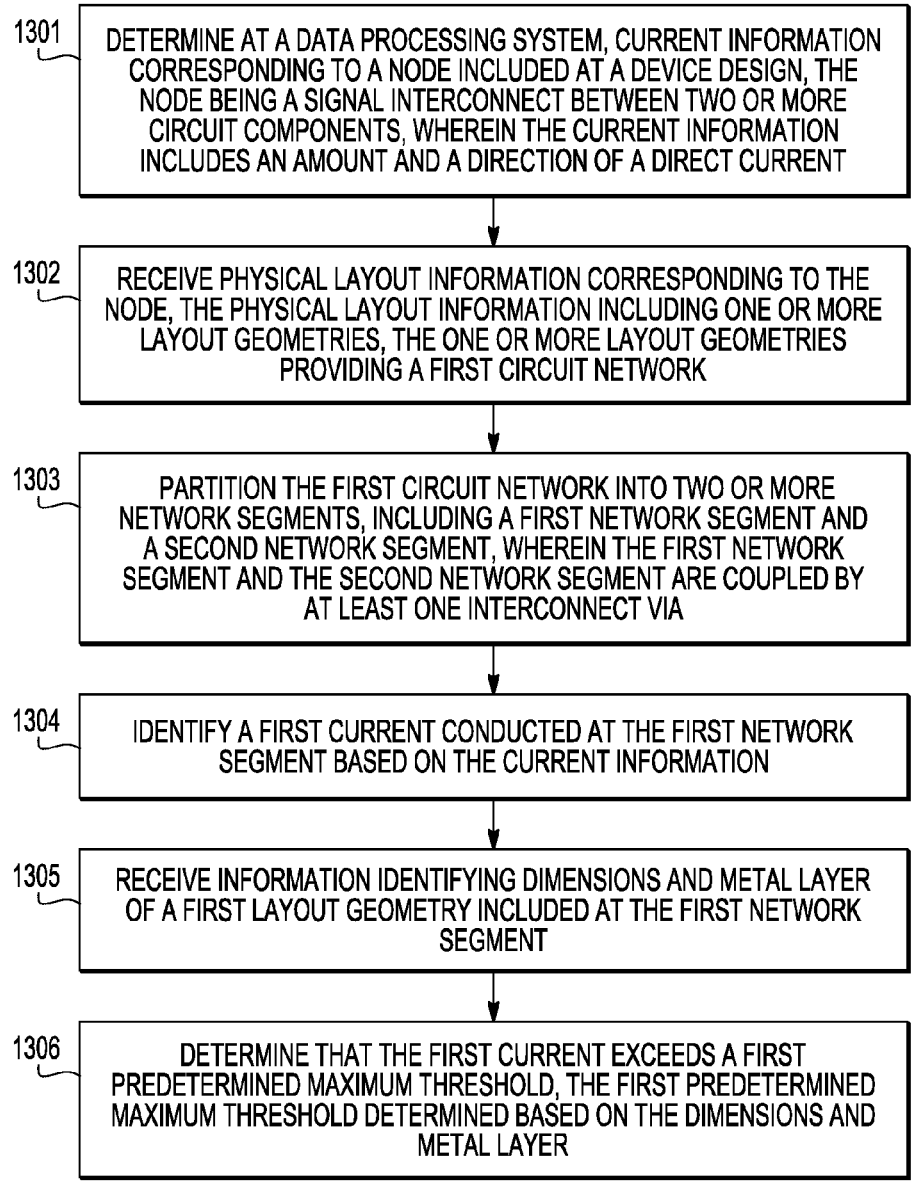
FIG. 13 is a flow diagram illustrating another method in accordance with a specific embodiment of the present disclosure.

FIG. 13 is a flow diagram illustrating another method 1300 in accordance with a specific embodiment of the present disclosure. The method 1300 begins at block 1301 where current information corresponding to a node included at a device design is determined at a data processing system, the node being a signal interconnect between two or more circuit components, wherein the current information includes an amount and a direction of a direct current. The method continues at block 1302 where physical layout information corresponding to the node is received, the physical layout information including one or more layout geometries, the one or more layout geometries providing a first circuit network. The method continues at block 1303 where the first circuit network is partitioned into two or more network segments, including a first network segment and a second network segment, wherein the first network segment and the second network segment are coupled by at least one interconnect via. The method continues at block 1304 where a first current conducted at the first network segment is identified based on the current information. The method continues at block 1305 where information identifying dimensions and metal layer of a first layout geometry included at the first network segment is received. The flow continues at block 1306 where it is determined whether the first current exceeds a first predetermined maximum threshold, the first predetermined maximum threshold determined based on the dimensions and metal layer.

While the computer readable storage device is shown to be a single storage device, the term "computer readable storage device" includes a single storage device or multiple storage devices, such as a centralized or distributed database, and/or associated caches and servers that store one or more sets of instructions. The term "computer readable storage device" shall also include any storage device that is capable of storing a set of instructions for execution by a processor or that cause a processing system to perform any one or more of the methods or operations disclosed herein.

In a particular non-limiting, exemplary embodiment, the computer readable storage device can include a solid-state memory such as a memory card or other package that houses one or more non-volatile read-only memories. Further, the computer readable storage device can be a random access memory or other volatile re-writeable memory. Additionally, the computer readable storage device can include a magneto-optical or optical medium, such as a disk or tapes or other storage device.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and processing systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In this document, relational terms such as "first" and "second", and the like, may be used solely to distinguish one entity or action from another entity or action without necessarily requiring or implying any actual relationship or order between such entities or actions or any actual relationship or order between such entities and claimed elements. The term "another", as used herein, is defined as at least a second or more. The terms "including", "having", or any variation thereof, as used herein, are defined as comprising.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method for determining whether a current at a network segment exceeds a threshold comprising:
    determining at a data processing system, current information corresponding to a node included at a device design, the node being a signal interconnect between two or more circuit components, wherein the current information includes an amount of a direct current;
    receiving physical layout information corresponding to the node, the physical layout information including one or more layout geometries, the one or more layout geometries providing a first circuit network;
    partitioning the first circuit network into two or more network segments, including a first network segment and a second network segment, wherein the first network segment and the second network segment are coupled by at least one interconnect via, and wherein partitioning comprises identifying a defined layout geometry and isolating that geometry at a corresponding network segment;
    identifying a first current conducted at the first network segment based on the current information;
    receiving information identifying dimensions and metal layer of a first layout geometry included at the first network segment; and
    determining that the first current exceeds a first predetermined maximum threshold, the first predetermined maximum threshold determined based on the dimensions and metal layer.

2. The method of claim 1, further comprising:
    identifying a second current conducted at the second network segment based on the current information; and
    determining that the second current does not exceed a second predetermined maximum threshold, the determining based on a metal layer used to implement the second network segment and not based on a length or a width of layout geometries included at the second network segment.

3. The method of claim 1, further comprising:
identifying a second current conducted at the second network segment based on the current information; and
determining a third current conducted at a third network segment based on a sum of the first current and the second current.

4. The method of claim 1, further comprising:
identifying a second current conducted at the second network segment based on the current information; and
determining a third current conducted at a third network segment based on subtracting the first current from the second current.

5. The method of claim 1, wherein determining that the first current exceeds a predetermined maximum threshold further comprises determining a maximum current density at the first layout geometry.

6. The method of claim 1, further comprising determining voltage information corresponding to the node, wherein the voltage information includes a first sink voltage at an input of a first circuit element, the input connected to the node, and wherein identifying a first current conducted at the first network segment is further based on the first sink voltage.

7. The method of claim 1, wherein determining that the first current exceeds a first predetermined maximum threshold further comprises determining that an electromigration design rule is violated.

8. The method of claim 1, wherein determining current information corresponding to a node comprises:
receiving at a circuit simulator a netlist representing connectivity of circuit components included at the device design;
simulating operation of the device design at the circuit simulator; and
storing the current information at a signal database.

9. The method of claim 1, further comprising:
receiving revised physical layout information corresponding to the node; and
determining whether the first current exceeds the first predetermined maximum threshold based on the current information and based on the revised physical layout information.

10. The method of claim 1, further comprising:
receiving revised current information corresponding to the node; and
determining whether the first current exceeds the first predetermined maximum threshold based on the physical layout information and based on the revised current information.

11. The method of claim 1, wherein the current information includes a first source current provided at an output of a first circuit component, the output connected to the node.

12. The method of claim 1, further comprising manufacturing an integrated circuit based on the device design.

13. A non-transitory computer readable medium storing a set of instructions, the set of instructions comprising instructions for determining whether a current at a network segment exceeds a threshold that when executed on a computer:
determine current information corresponding to a node included at a device design, the node being a signal interconnect between two or more circuit components, wherein the current information includes an amount of a direct current;
receive physical layout information corresponding to the node, the physical layout information including one or more layout geometries, the one or more layout geometries providing a first circuit network;
partition the first circuit network into two or more network segments, including a first network segment and a second network segment, wherein the first network segment and the second network segment are coupled by at least one interconnect via;
identify a first current conducted at the first network segment based on the current information;
receive information identifying dimensions and metal layer of a first layout geometry included at the first network segment;
determine that the first current exceeds a first predetermined maximum threshold, the first predetermined maximum threshold determined based on the dimensions and metal layer;
identify a second current conducted at the second network segment based on the current information; and
determine that the second current does not exceed a second predetermined maximum threshold, the determining based on a metal layer used to implement the second network segment and not based on a length or a width of layout geometries included at the second networks segment.

14. The non-transitory computer readable medium of claim 13, wherein the set of instructions further comprises instructions to:
identify a second current conducted at the second network segment based on the current information; and
determine a third current conducted at a third network segment based on a sum of the first current and the second current.

15. A system for determining whether a current at a network segment exceeds a threshold comprising a data processor to execute a set of instructions to:
determine current information corresponding to a node included at a device design, the node being a signal interconnect between two or more circuit components, wherein the current information includes a first source current provided at an output of a first circuit component, the output connected to the node;
receive physical layout information corresponding to the node, the physical layout information including one or more layout geometries, the one or more layout geometries providing a first circuit network;
partition the first circuit network into two or more network segments, including a first network segment and a second network segment, wherein the first network segment and the second network segment are coupled by at least one interconnect via;
identify a first current conducted at the first network segment based on the current information;
receive information identifying dimensions and metal layer of a first layout geometry included at the first network segment; and
determine that the first current exceeds a first predetermined maximum threshold, the first predetermined maximum threshold determined based on the dimensions and metal layer.

16. The system of claim 15, further comprising instructions to:
identify a second current conducted at the second network segment based on the current information; and
determine that the second current does not exceed a second predetermined maximum threshold, the determining based on a metal layer used to implement the second network segment and not based on a length or a width of layout geometries included at the second network segment.

17. A method for determining whether a current at a network segment exceeds a threshold comprising:

determining at a data processing system, current information corresponding to a node included at a device design, the node being a signal interconnect between two or more circuit components, wherein the current information includes an amount of direct current and includes a first source current provided at an output of a first circuit component, the output connected to the node;

receiving physical layout information corresponding to the node, the physical layout information including one or more layout geometries, the one or more layout geometries providing a first circuit network;

partitioning the first circuit network into two or more network segments, including a first network segment and a second network segment;

identifying a first current conducted at the first network segment based on the current information;

receiving information identifying dimensions and metal layer of a first layout geometry included at the first network segment; and determining that the first current exceeds a first predetermined maximum threshold, the first predetermined maximum threshold determined based on the dimensions and metal layer.

* * * * *